US012641940B2

(12) United States Patent
    Lo et al.

(10) Patent No.: US 12,641,940 B2
(45) Date of Patent: May 26, 2026

(54) FABRICATION METHOD FOR A DISPLAY DEVICE

(71) Applicant: PlayNitride Display Co., Ltd., MiaoLi County (TW)

(72) Inventors: Yu-Yun Lo, MiaoLi County (TW); Han-Cheng Tsou, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 396 days.

(21) Appl. No.: 18/408,525

(22) Filed: Jan. 9, 2024

(65) Prior Publication Data

US 2025/0194312 A1    Jun. 12, 2025

(30) Foreign Application Priority Data

Dec. 11, 2023    (TW) ................................. 112148064

(51) Int. Cl.
    *H10H 20/00*        (2025.01)
    *H10H 20/819*       (2025.01)
                (Continued)

(52) U.S. Cl.
    CPC ...... *H10H 20/857* (2025.01); *H10H 20/0361* (2025.01); *H10H 20/819* (2025.01);
                (Continued)

(58) Field of Classification Search
    CPC .. H10H 20/017; H10H 20/018; H10H 20/019; H10H 20/021; H10H 20/0361;
                (Continued)

(56) References Cited

U.S. PATENT DOCUMENTS

2019/0206849 A1*  7/2019  Jang ...................... H10H 29/39
2023/0320111 A1  10/2023  Lee et al.
2023/0389391 A1  11/2023  Song et al.

FOREIGN PATENT DOCUMENTS

WO        2022241747        11/2022

OTHER PUBLICATIONS

"Office Action of Taiwan Related Application, Application No. 112148064", issued on May 21, 2024, p. 1-p. 6.

* cited by examiner

*Primary Examiner* — Reema Patel
(74) *Attorney, Agent, or Firm* — JCIPRNET

(57)                ABSTRACT

A fabrication method for a display device includes the following operation. A first epitaxial structure layer and a second epitaxial structure layer are sequentially stacked on a first substrate. The second epitaxial structure layer and the first epitaxial structure layer are etched to form first micro-light-emitting elements and second micro-light-emitting elements. The first micro-light-emitting elements and the second micro-light-emitting elements are covered with a conductive layer. The conductive layer is patterned to be etched to expose the control panel. The conductive layer is divided into first conductive layers and second conductive layers. The first micro-light-emitting elements are correspondingly disposed in the first conductive layers. The second micro-light-emitting elements are correspondingly disposed in the second conductive layers. The first conductive layers disposed on the control panel and the second conductive layers disposed on the control panel are separated from each other and are electrically insulated from each other.

10 Claims, 12 Drawing Sheets

(51) Int. Cl.

| | |
|---|---|
| *H10H 20/841* | (2025.01) |
| *H10H 20/851* | (2025.01) |
| *H10H 20/856* | (2025.01) |
| *H10H 20/857* | (2025.01) |
| *H10W 90/00* | (2026.01) |
| *H10H 20/01* | (2025.01) |

(52) U.S. Cl.
CPC ........ *H10H 20/841* (2025.01); *H10H 20/851* (2025.01); *H10H 20/8514* (2025.01); *H10H 20/856* (2025.01); *H10W 90/00* (2026.01); *H10H 20/034* (2025.01); *H10H 20/0364* (2025.01)

(58) Field of Classification Search
CPC ........... H10H 20/0362; H10H 20/0363; H10H 20/0364; H10H 29/011
See application file for complete search history.

FABRICATION METHOD FOR A DISPLAY DEVICE

CROSS-REFERENCE TO RELATED APPLICATION

This application claims the priority benefit of Taiwan application serial no. 112148064, filed on Dec. 11, 2023. The entirety of the above-mentioned patent application is hereby incorporated by reference herein and made a part of this specification.

BACKGROUND

Technical Field

The present invention relates to a display device and fabrication method therefor.

Description of Related Art

In recent years, displays with pixel sizes reduced to micron levels have become one of the key research directions. Since space between pixels (sub-pixels) of micro displays has been significantly reduced, the yield rate is easily affected when the micro-light-emitting chips of the three primary colors RGB in mass transfer process are transferred to the control panel (Complementary Metal Oxide Semiconductor, CMOS).

In order to improve the problems of difficulties of transferring, known techniques are to transfer a common semiconductor layer epitaxial structure of a single color (such as blue light), or a plurality of wafers of a single color with a common electrode package. The above two techniques can be easily achieved for full-surface transferring, but they require the use of quantum dot (QD) materials to achieve full-color display (for example, red and green quantum dots). Based on the requirement of converting wavelength, the quantum dot material for green light conversion has a smaller volume and a larger surface area, which makes it difficult to improve the conversion efficiency of green light, and its lifespan is also easily affected.

SUMMARY

The present invention provides a display device that can realize a single-chip full-color micro display without requirement for mass transfer process, which helps to significantly improve the yield rate. In addition, the present invention is not limited to application in quantum dot color conversion technology, but can also be applied to primary color micro-light-emitting chips. The fabrication method of the display device of the present invention is also provided.

An embodiment of the present invention provides a display device, which includes a control panel, a plurality of conductive layers, a plurality of first micro-light-emitting elements, and a plurality of second micro-light-emitting elements. The plurality of conductive layers are respectively directly connected to the control panel. The plurality of conductive layers are divided into a plurality of first conductive layers with first thickness and a plurality of second conductive layers with second thickness. The second thickness is greater than the first thickness. The plurality of first micro-light-emitting elements are disposed on one of the pluralities of first conductive layers. The first micro-light-emitting element has a first light-emitting layer. The first light-emitting layer emits light with a first color. The plurality of second micro-light-emitting elements are disposed on one of the plurality of second conductive layers. The second micro-light-emitting element has a second light-emitting layer. The second light-emitting layer emits light with a second color which is different from the first color. projections of the plurality of first micro-light-emitting elements on the control panel do not overlap with projections of the plurality of second micro-light-emitting elements on the control panel.

An embodiment of the present invention provides a fabrication method of a display device, which includes the following operation. A first epitaxial structure layer and a second epitaxial structure layer are sequentially stacked on a first substrate. The second epitaxial structure layer from a first side and the first epitaxial structure layer from a second side are etched to form a plurality of first micro-light-emitting elements and a plurality of second micro-light-emitting elements, wherein color of light emitted by the plurality of first micro-light-emitting elements are different from color of light emitted by the plurality of second micro-light-emitting elements. The plurality of the first micro-light-emitting elements and the plurality of the second micro-light-emitting elements are covered with a conductive layer, so that the plurality of the first micro-light-emitting elements and the plurality of the second micro-light-emitting elements are bonded to a control panel through the conductive layer, wherein projections of the plurality of first micro-light-emitting elements on the control panel do not overlap with projections of the plurality of second micro-light-emitting elements on the control panel. The conductive layer is patterned to be etched to expose the control panel, wherein the conductive layer is etched and divided into a plurality of first conductive layers and a plurality of second conductive layers, the plurality of first micro-light-emitting elements are correspondingly disposed in the plurality of first conductive layers, the plurality of second micro-light-emitting elements are correspondingly disposed in the plurality of second conductive layers, and the plurality of first conductive layers disposed on the control panel and the plurality of second conductive layers disposed on the control panel are separated from each other and are electrically insulated from each other.

Based on the above, in the display device of the embodiment of the present invention, since the second thickness of the second conductive layer is greater than the first thickness of the first conductive layer, and the projections of the first micro-light-emitting element on the control panel do not overlap with the projections of the second micro-light-emitting element on the control panel. Therefore, micro-light-emitting elements with different light-emitting colors are independent of each other and do not overlap with each other. A light-emitting area within the pixel formed by micro-light-emitting elements with different light-emitting colors can be freely allocated or designed redundantly, therefore preventing from crosstalk or parasitic capacitance problems arising from the circumstances that the micro-light-emitting elements overlap with each other. In the embodiment of the fabrication method of the display device of the present invention, the first micro-light-emitting elements and the second micro-light-emitting elements are stacked and etched, and the first micro-light-emitting elements finally retained on the control panel and the second micro-light-emitting elements finally retained on the control panel do not overlap with each other. Therefore, the display device and fabrication method in the embodiment of the present invention make micro-light-emitting elements with different colors of light to be formed together without mass transfer process. In this way, it can significantly improve the yield rate of the display device fabrication and reduce the cost of transferring and repairing.

DESCRIPTION OF THE EMBODIMENTS

Figure 1A:
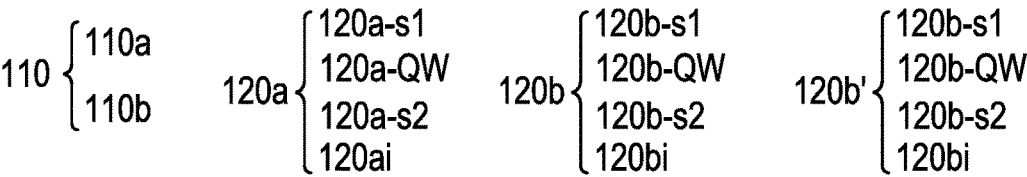
FIG. 1A to FIG. 1B are schematic diagrams of a display device according to an embodiment of the present invention.
Figure 1A:
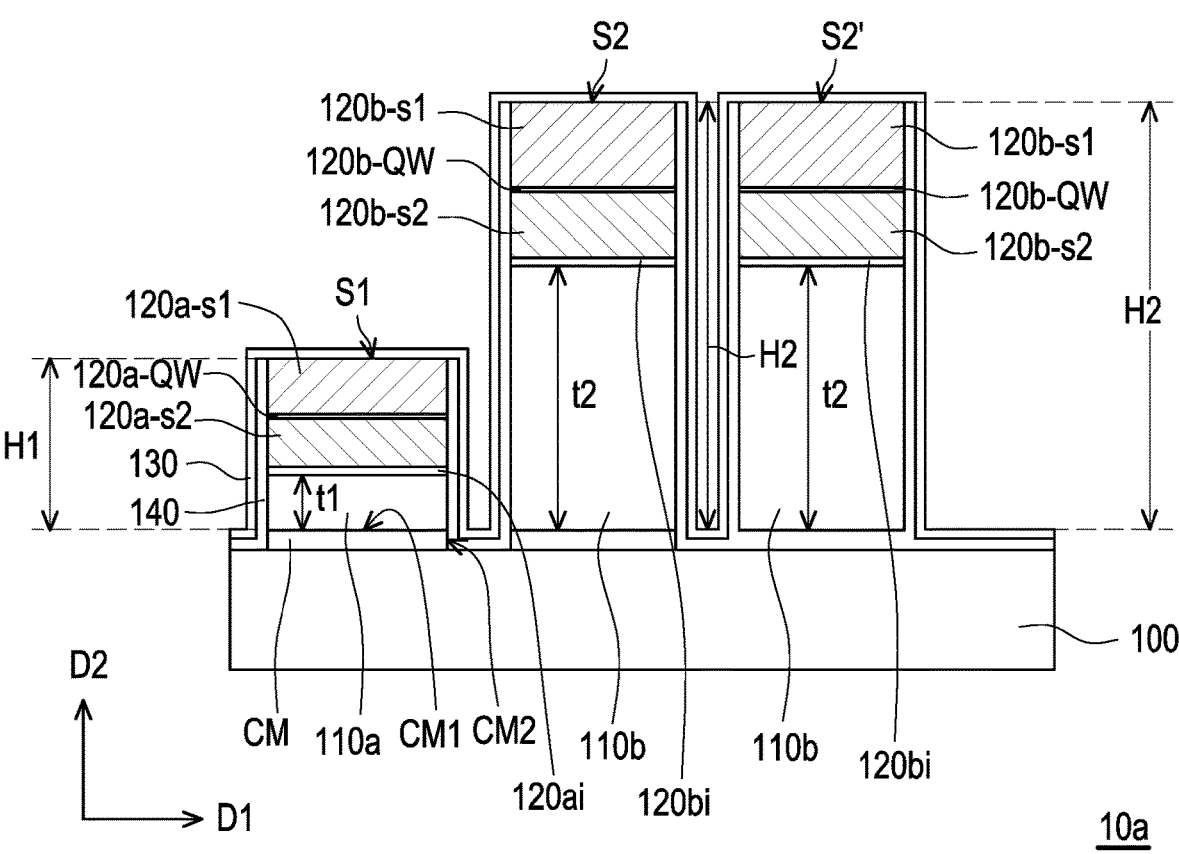
Figure 1B:
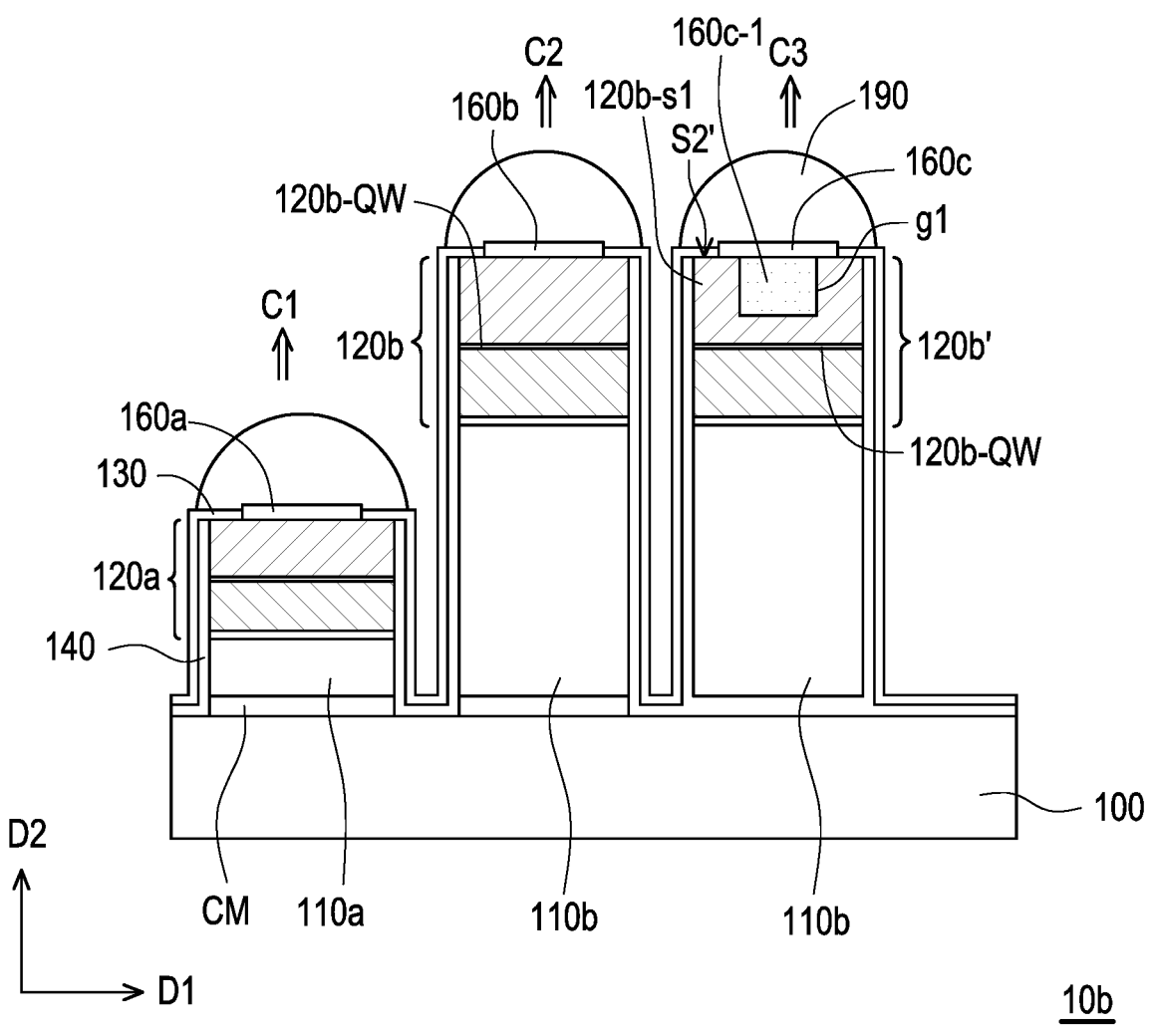

FIG. 1A to FIG. 1B are schematic diagrams of a display device according to an embodiment of the present invention. Please refer to FIG. 1A and FIG. 1B. The display device 10a of this embodiment includes a control panel 100, a plurality of conductive layers 110, a plurality of first micro-light-emitting elements 120a, a plurality of second micro-light-emitting elements 120b, a light reflecting layer 130 and an insulating layer 140. The plurality of conductive layers 110 are respectively directly connected to the bonding layer CM of the control panel 100, and the plurality of conductive layers 110 disposed on the control panel 100 are separated from each other and are electrically insulated from each other.

The control panel 100 defines a plurality of pixel areas, and FIGS. 1A-1B illustrates one of the pixel areas. A first micro-light-emitting element 120a, a second micro-light-emitting element 120b and a second micro-light-emitting element 120b' are disposed in the pixel area. However, in other embodiments, the pixel area may also include more than four micro-light-emitting elements, but the conductive layer 110 has three or less than three thicknesses.

The plurality of conductive layers 110 are divided into a plurality of first conductive layers 110a with a first thickness t1 and a plurality of second conductive layers 110b with a second thickness t2, and the second thickness t2 is greater than the first thickness t1. The second thickness t2 is greater than the height H1 of the top surface S1 of the first micro-light-emitting element 120a relative to the bonding layer CM.

The first micro-light-emitting element 120a includes first-type semiconductors 120a-s1 and second-type semiconductors 120a-s2. The second micro-light-emitting element 120b includes a first-type semiconductor 120b-s1 and a second-type semiconductor 120b-s2. In this embodiment, the first micro-light-emitting element 120a may also include a transparent conductive layer 120ai, connected between the second-type semiconductor 120a-s2 and the first conductive layer 110a. The second micro-light emitting element 120b may also include a transparent conductive layer 120bi connected between the second type semiconductor 120b-s2 and the second conductive layer 110b. The material of the transparent conductive layers 120ai and 120bi is, for example, indium tin oxide or other transparent conductive materials.

Please refer to FIG. 1B, a plurality of first micro-light-emitting elements 120a are respectively disposed on a plurality of first conductive layers 110a, and have the first light-emitting layer 120a-QW to emit light with the first color C1 (for example, green). A plurality of second micro-light-emitting elements 120b are respectively disposed on a plurality of second conductive layers 110b, and have the second light-emitting layer 120b-QW to emit light with a second color C2 (for example, blue) that is different from the first color C1. Herein, the projections of the plurality of first micro-light-emitting elements 120a on the control panel 100, the projections of the plurality of second micro-light-emitting elements 120b on the control panel 100, and the projections of the plurality of second micro-light-emitting elements 120b' on the control panel 100 do not overlap with each other.

Each of first-type semiconductors is located on a side of the first micro-light-emitting elements 120a, 120b, and 120b' away from the control panel 100, and surface of each of the first-type semiconductor may have a roughened structure. Herein, each of the first-type semiconductors is, for example, an n-type semiconductor, and surface of the n-type semiconductor can be roughened by ion bombardment (for example, plasma formed with argon gas) or a chemical mechanical polishing process. In addition, the roughening process can simultaneously thin the thickness of each of the first-type semiconductors, so that a ratio of a thickness of each of the first-type semiconductors to a thickness of each of the second-type semiconductors can be between 1 and 1.6. However, the present invention is not limited thereto. For different epitaxial processes, the first-type semiconductors may also be p-type or other semiconductors, and type of the second-type semiconductor is not limited here.

The light reflecting layer 130 covers the plurality of first micro-light-emitting elements 120a, the plurality of second micro-light-emitting elements 120b, peripheral surfaces of the plurality of first conductive layers 110a and peripheral surfaces of the plurality of second conductive layers 110b and the control panel 100. The plurality of first conductive layers 110a and the plurality of second conductive layers 110b include light reflective materials. In this embodiment, the light reflecting layer 130 is a common electrode layer of the plurality of first micro-light-emitting elements 120a and the plurality of second micro-light-emitting elements 120b, and is electrically connected to the first-type semiconductor 120a-s1 and the first-type semiconductor 120b-s1.

The insulating layer 140 is a single film layer (for example, a silicon dioxide film layer), which is disposed between the light reflecting layer 130 and the first micro-light-emitting element 120a or the second micro-light-emitting element 120b to cover the plurality of the first micro-light-emitting elements 120a and the plurality of the second micro-light-emitting element 120b. The insulating layer 140 is configured to shield the second-type semiconductor 120a-s2 of the first micro-light-emitting element 120a and the second-type semiconductor 120b-s2 of the second micro-light-emitting element 120b from contacting the light reflecting layer 130.

The plurality of bonding layers CM on surface of the control panel 100 are, for example, metal circuit layers. Each of the plurality of bonding layers CM has a bonding surface CM1 and a side wall surface CM2 connected to the bonding surface CM1, and the side wall surface CM2 is an etched surface. The plurality of conductive layers 110 are bonded to the plurality of bonding surface CM1 to connect the control panel 100. In this embodiment, the peripheral surfaces of the plurality of the conductive layers 110 and the side wall surfaces CM2 of the plurality of the bonding layers CM form a continuous surface. In addition, in this embodiment, the peripheral surfaces of the plurality of the conductive layers 110 and the side wall surfaces CM2 of the plurality of conductive layers 110 are also etched surfaces.

In FIG. 1B, after the light reflecting layer 130 on the central area of the top S1, S2, S2' of the first micro-light-emitting element 120a and the second micro-light-emitting element 120b, 120b' are removed, the display device 10a changes into display device 10b. The display device 10b may also include color filters 160a~160c and lens layer 190. The color filters 160a~160c are respectively disposed on the plurality of first micro-light-emitting elements 120a and the plurality of second micro-light-emitting elements 120b and 120b'. The colors of color filters 160a, 160b and 160c (that is, the color of light allowed to pass through) respectively correspond to the color of light emitted by the first light-emitting layer 120a-QW and the color of light emitted by the second micro-light-emitting elements 120b and 120b', that is, the colors respectively correspond to the first color C1 (for example, green), second color C2 (such as blue), and third color C3 (such as red), but the example here is not limited.

Since the second micro-light-emitting elements 120b and 120b' of this embodiment have the same second light-emitting layer 120b-QW, the display device 10b can include the color conversion structure 160c-1. The color conversion structure 160c-1 is, for example, a quantum dot color conversion structure, which is disposed on part of the plurality of second micro-light-emitting elements 120b'. For example, the second micro-light-emitting element 120b' includes an epitaxial structure, the second light-emitting layer 120b-QW is located within the epitaxial structure, and the epitaxial structure having a groove g1 located between a top surface S2' of the second micro-light-emitting element 120b' away from the control panel 100 and a second light-emitting layer 120b-QW of the second micro-light-emitting element 120b'. The color conversion structure 160c-1 is disposed in the groove. That is, the color conversion structure 160c-1 can be disposed within the groove g1 formed by the first-type semiconductor 120b-s1 of the second micro-light-emitting element 120b', and is enclosed by the color filter 160c covering the top surface S2'. In this way, the light with second color C2 emitted by the second light-emitting layer 120b-QW can be converted into the light with the third color C3 through the color conversion structure 160c-1.

The lens layer 190 is disposed on each of micro-light-emitting elements to help gather the light passing through the color filter to improve the display effect.

Figure 2A:
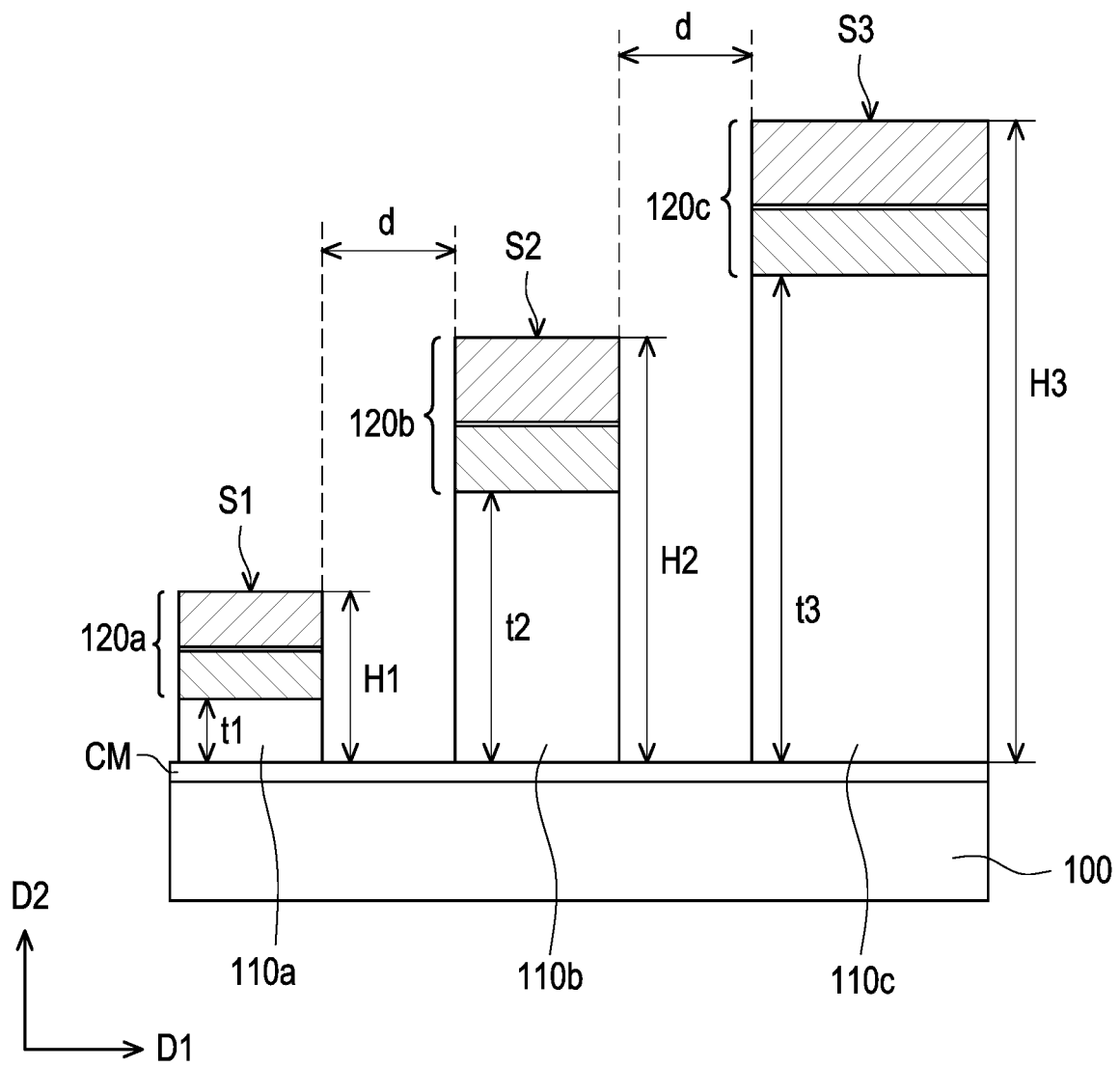
FIG. 2A to FIG. 2B are schematic diagrams of a display device according to another embodiment of the present invention.
Figure 2B:
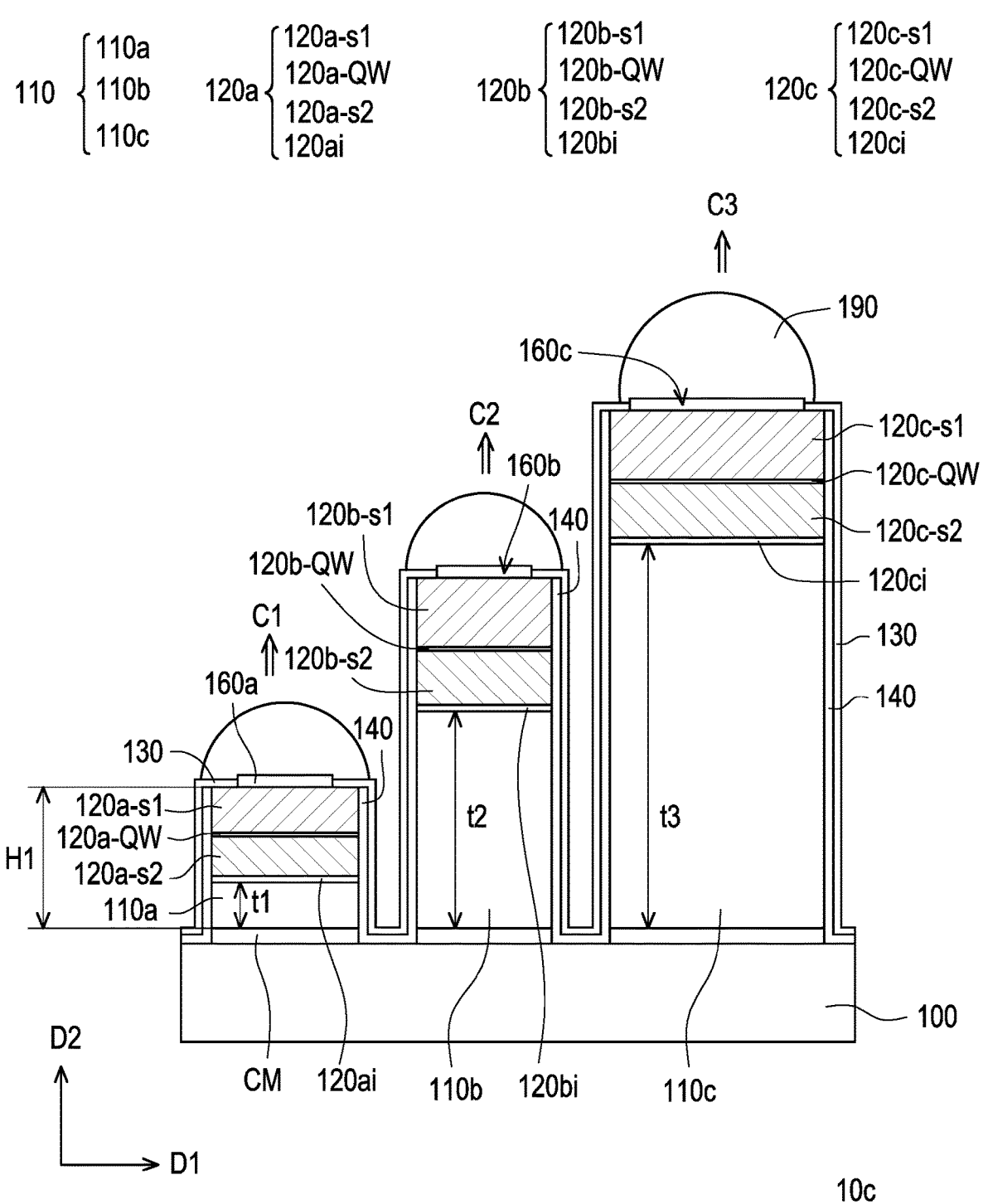

FIG. 2A to FIG. 2B are schematic diagrams of a display device according to another embodiment of the present invention. The differences between FIGS. 2A-2B and FIGS. 1A-1B are that the display device 10c further includes a plurality of third micro-light-emitting elements 120c. The plurality of third micro-light-emitting elements 120c are respectively disposed on a plurality of third conductive layers 110c, and have the third light-emitting layer 120c-QW emitting light with a third color C3 (for example, red) that is different from the first color C1 and the second color C2. That is, there are first micro-light-emitting element 120a, second micro-light-emitting element 120b and third micro-light-emitting element 120c in the pixel area, and the third light-emitting layer 120c-QW of the third micro-light-emitting element 120 can directly emit light without converting color of light through the second micro-light-emitting element 120b. In one embodiment, one pixel area may include at least four micro-light-emitting elements. That is, in each of the above embodiments, the number of microlight-emitting elements with any color may be greater than one. In addition, light-emitting areas of the first micro-light-emitting element 120a, light-emitting areas of the second micro-light-emitting element 120b and light-emitting areas of the third micro-light-emitting element 120c may be different. For example, the top surface S3 of the third micro-light-emitting element 120c in FIG. 2A may have a larger area than the top surfaces S1 and S2 of the other two micro-light-emitting elements. In this way, when brightness of each of micro-light-emitting elements is different or the decay curve of brightness over time of each of micro-light-emitting elements is different, number or size of micro-light-emitting elements can be adjusted to meet the design requirements of the display.

A plurality of conductive layers 110 may also divided into a third thickness. For example, the third conductive layer 110c has a third thickness t3 greater than the second thickness t2, and the third thickness t3 can be further greater than height H2 of the top surface S2 of the second micro-light emitting element 120b relative to the bonding layer CM. The top surface S3 of the third micro-light emitting element 120c relative to the bonding layer CM has a height H3.

There is a space d between the first micro-light-emitting element 120a and the second micro-light-emitting element 120b, and between the second micro-light-emitting element 120b and the third micro-light-emitting element 120c in the direction parallel to the control panel 100. A ratio of the space d to the first thickness t1 is, for example, greater than or equal to 0.25, but the present invention is not limited thereto.

The space d may be, for example, in the range from 0.25 μm to 1 μm. The ratio of the space d to the height H1 may be, for example, 1:4, 1:8, or 1:16. The ratio of height H1 to height H2 to height H3 may be, for example, 2:3:4. In various embodiments introduced in the present invention, all the space d between micro-light-emitting elements is the same. However, the actual value of the space d may be different based on process margin or yield rate.

In this embodiment, the third micro-light-emitting element 120c may also include a transparent conductive layer 120ci connected between the second-type semiconductor 120c-s2 and the third conductive layer 110c. The material of the transparent conductive layer 120ci is, for example, indium tin oxide or other transparent conductive materials.

FIG. 3A to FIG. 3L are schematic flow diagrams of a fabrication method of a display device according to an embodiment of the present invention. Please refer to FIGS. 3A-3L, the fabrication method of the display device of this embodiment includes the following operation.

Figure 3A:
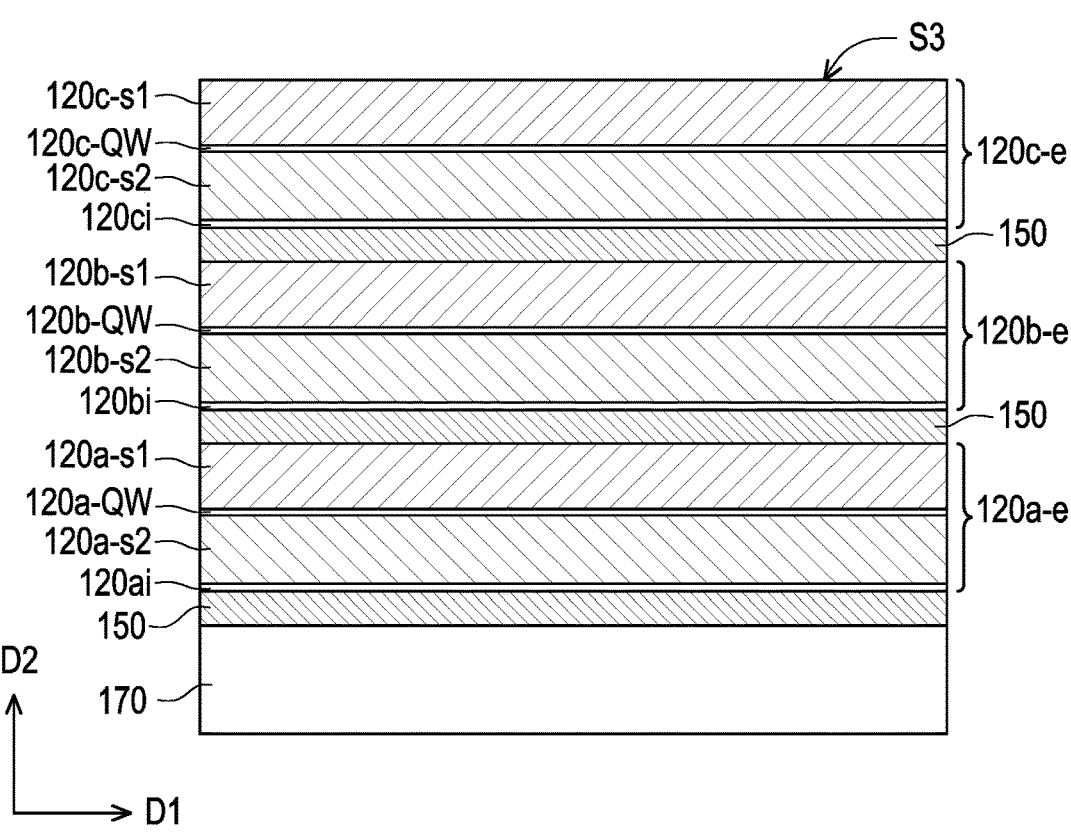
FIG. 3A to FIG. 3L are schematic flow diagrams of a fabrication method of a display device according to an embodiment of the present invention.

First, please refer to FIG. 3A. A first epitaxial structure layer 120a-e and a second epitaxial structure layer 120b-e are sequentially stacked on a first substrate 170. In this embodiment, a third epitaxial structure layer 120c-e may be stacked on the second epitaxial structure layer 120b-e after stacking the second epitaxial structure layer 120b-e. The first substrate 170 is, for example, a substrate of sapphire material or a substrate of other materials. The first epitaxial structure layer 120a-e includes a first type semiconductor 120a-s1, a second type semiconductor 120a-s2, and a first light-emitting layer 120a-QW disposed between the first type semiconductor 120a-s1 and the second type semiconductor 120a-s2. The second epitaxial structure layer 120b-e includes a first-type semiconductor 120b-s1, a second-type semiconductor 120b-s2, and a second light-emitting layer 120b-QW disposed between the first-type semiconductor 120b-s1 and the second-type semiconductor 120b-s2. The third epitaxial structure layer 120c-e includes a first-type semiconductor 120*c-s*1, a second-type semiconductor 120*c-s*2, and a third light-emitting layer 120*c*-QW disposed between the first-type semiconductor 120*c-s*1 and the second-type semiconductor 120*c-s*2. In addition, the epitaxial structure layers are bonded to each other through the adhesive layer 150 and the epitaxial structure layers are bonded to the first substrate 170 through the adhesive layer 150. In this embodiment, it further includes a transparent conductive layer 120*ai* located on a side of the first epitaxial structure layer 120*a-e* adjacent to the first substrate 170, a transparent conductive layer 120*bi* located on a side of the second epitaxial structure layer 120*b-e* adjacent to the first substrate 170, and a transparent conductive layer 120*ci* located on a side of the third epitaxial structure layer 120*c-e* adjacent to the first substrate 170. In addition, in this embodiment, after stacking the first epitaxial structure layers 120*a-e* on the first substrate 170, the first-type semiconductors 120*a-s*1 may be thinned by using ion bombardment or chemical mechanical polishing and then the second epitaxial structure layer 120*b-e* is stacked on the first epitaxial structure layer 120*a-e*. Similarly, the first type semiconductor 120*b-s*1 and the first type semiconductor 120*c-s*1 can also be performed with the above thinning process.

Figure 3B:
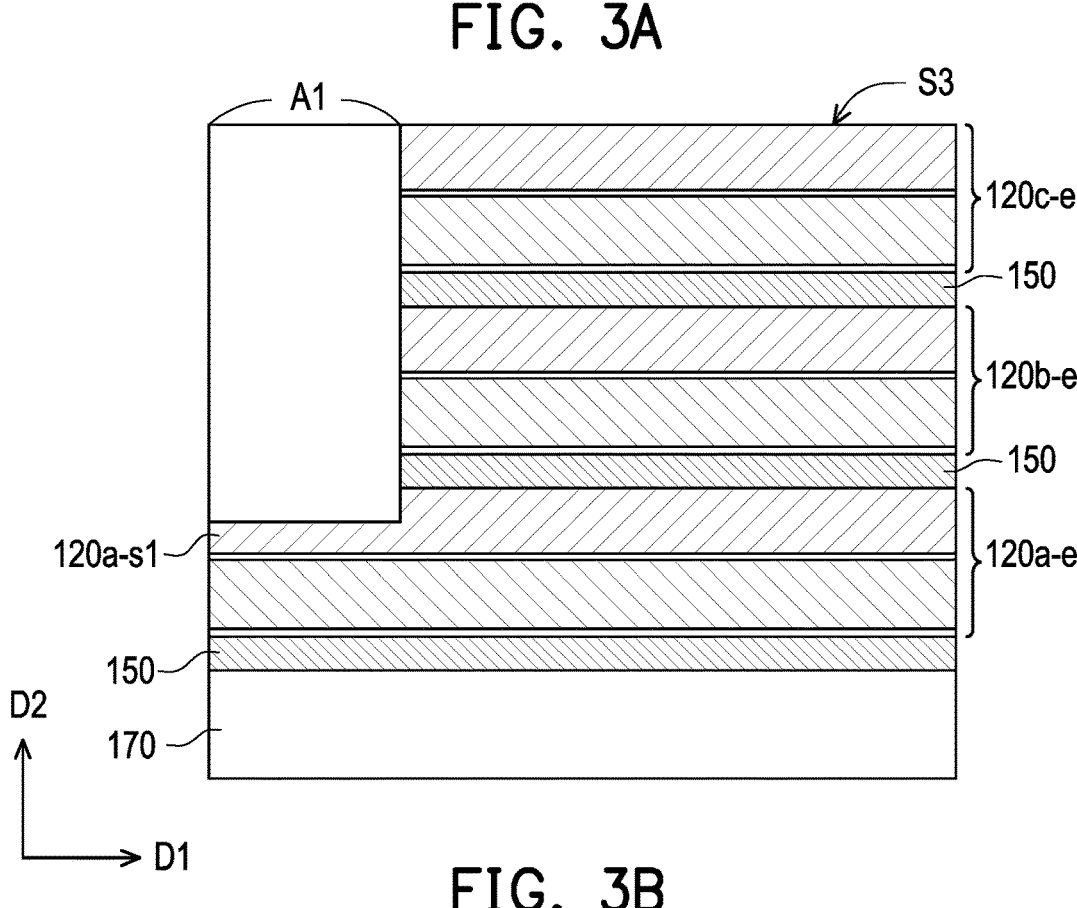

Please refer to FIG. 3B, in the operation of etching the second epitaxial structure layer 120*b-e* from a first side. In this embodiment, for example, the third epitaxial structure layer 120*c-e* and the second epitaxial structure layer 120*b-e* are etched from the first side. In this embodiment, the side of the third epitaxial structure layer 120*c-e* is regarded as the first side in the operation of sequentially stacking the first epitaxial structure layer 120*a-e*, the second epitaxial structure layer 120*b-e* and the third epitaxial structure layer 120*c-e*. The side of the first epitaxial structure layer 120*a-e* is regarded as the second side. In this embodiment, plasma etching technology can be configured to select a portion of the top surface S3 of the third epitaxial structure layer 120*c-e* to etch the cross-sectional area A1 of FIG. 3B. Then the third epitaxial structure layer 120*c-e*, the second epitaxial structure layer 120*b-e* and a portion of the first epitaxial structure layer 120*a-e* are etched sequentially, followed by exposing the first semiconductor 120*a-s*1.

Figure 3C:
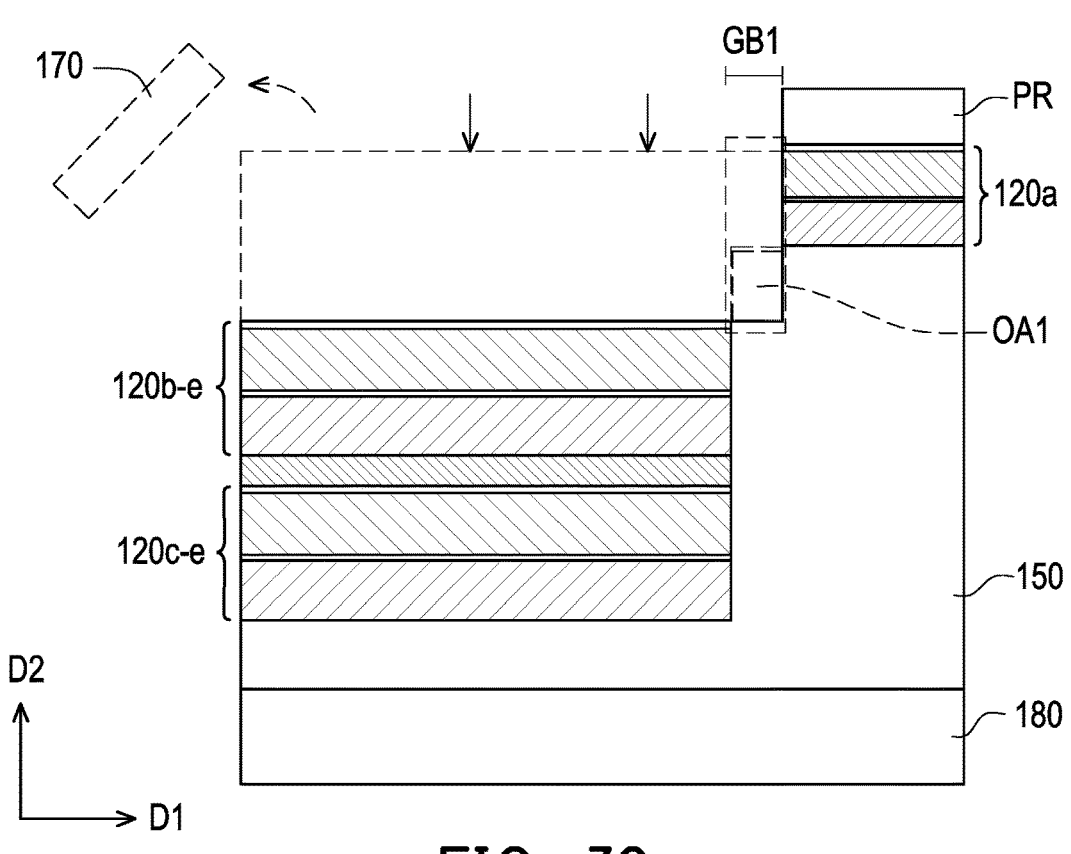

Please refer to FIG. 3C, a second substrate 180 is provided, and the first epitaxial structure layer 120*a-e*, the etched second epitaxial structure layer 120*b-e*, and the etched third epitaxial structure layer 120*c-e* are transferred to the second substrate 180, and then the first substrate 170 is removed.

After removing the first substrate 170, the first epitaxial structure layers 120*a-e* are etched from the second side. For example, a photoresist layer PR can be disposed on the first epitaxial structure layer 120*a-e*, and etching technology (such as plasma etching) is configured to remove overlapping portions of the first epitaxial structure layer 120*a-e* relative to the second epitaxial structure layer 120*b-e* and the third epitaxial structure layer on the second substrate 180. In this embodiment, there is a gap GB1 located between projection of the first epitaxial structure layer 120*a-e* on the second substrate 180 and projections of the second epitaxial structure layer 120*b-e* and the third epitaxial structure layer 120*c-e* on the second substrate 180. The gap GB1 is formed by making a region of etching the second epitaxial structure layer 120*b-e* and the third epitaxial structure layer 120*c-e* from the first side overlap a region of etching the first epitaxial structure layer 120*a-e* from the second side, and the overlapping portion OA1 is shown in FIG. 3C. Specifically, after removing the first substrate 170, a wider first epitaxial structure layer 120*a-e* is etched according to the photomask pattern design, or further etching a portion of the second epitaxial structure layer 120*b-e* and the third epitaxial structure layer 120*c* are etched and can be performed to form gap GB1. In this way, the etched remaining first epitaxial structure layer 120*a-e* forms a plurality of first micro-light-emitting elements 120*a* independent of the second epitaxial structure layer 120*b-e* and the third epitaxial structure layer 120*c-e* (in FIG. 3C, a first micro-light-emitting element 120*a* is schematically illustrated).

Figure 3D:
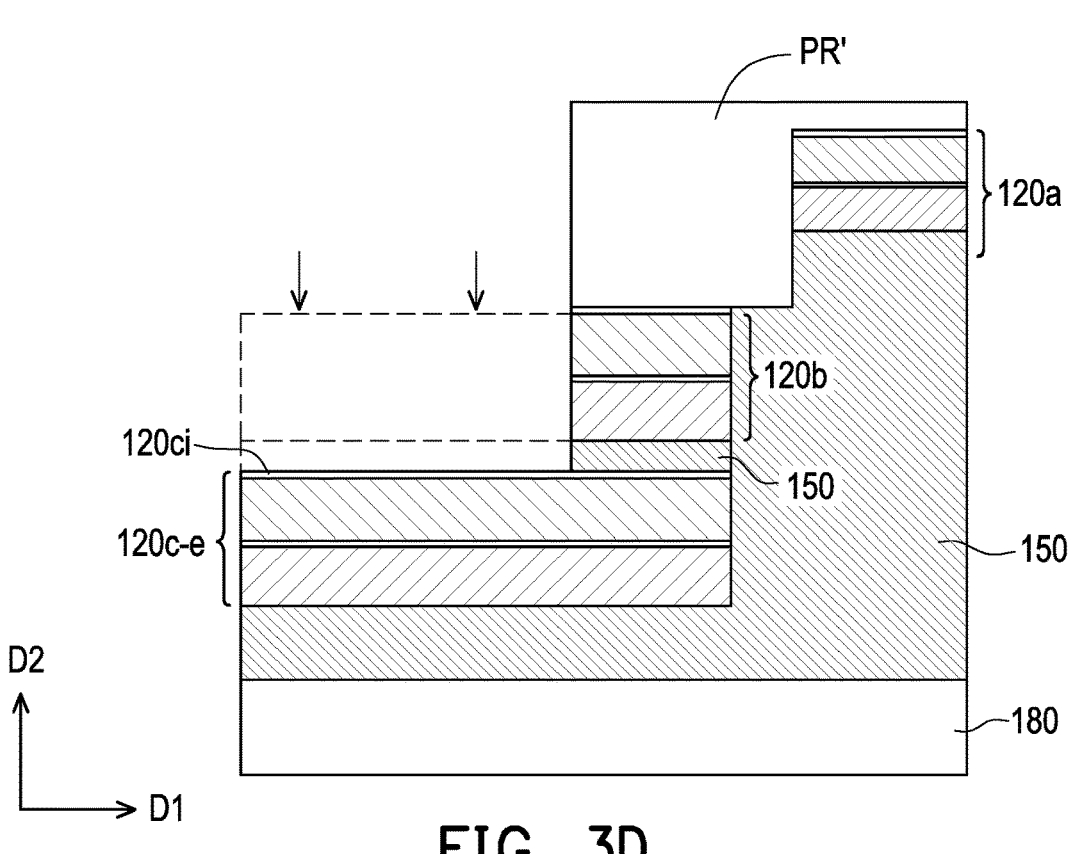

Then, please refer to FIG. 3D, the photoresist layer PR' is disposed on the display device, and only a part of the second epitaxial structure layer 120*b-e* is exposed. The area of the second epitaxial structure layer 120*b-e* without the photoresist layer PR' disposed is etched. The transparent conductive layer 120*ci* located on the top surface of the third epitaxial structure layer 120*c-e* is exposed. Meanwhile, unetched portions of the second epitaxial structure layer 120*b-e* form a plurality of second micro-light-emitting elements 120*b* (FIG. 3D schematically illustrates a second micro-light-emitting element 120*b* as an example). The color of light emitted by the first micro-light-emitting element 120*a* is different from the color of light emitted by the second micro-light-emitting element 120*b*.

Figures 3E, 3F:
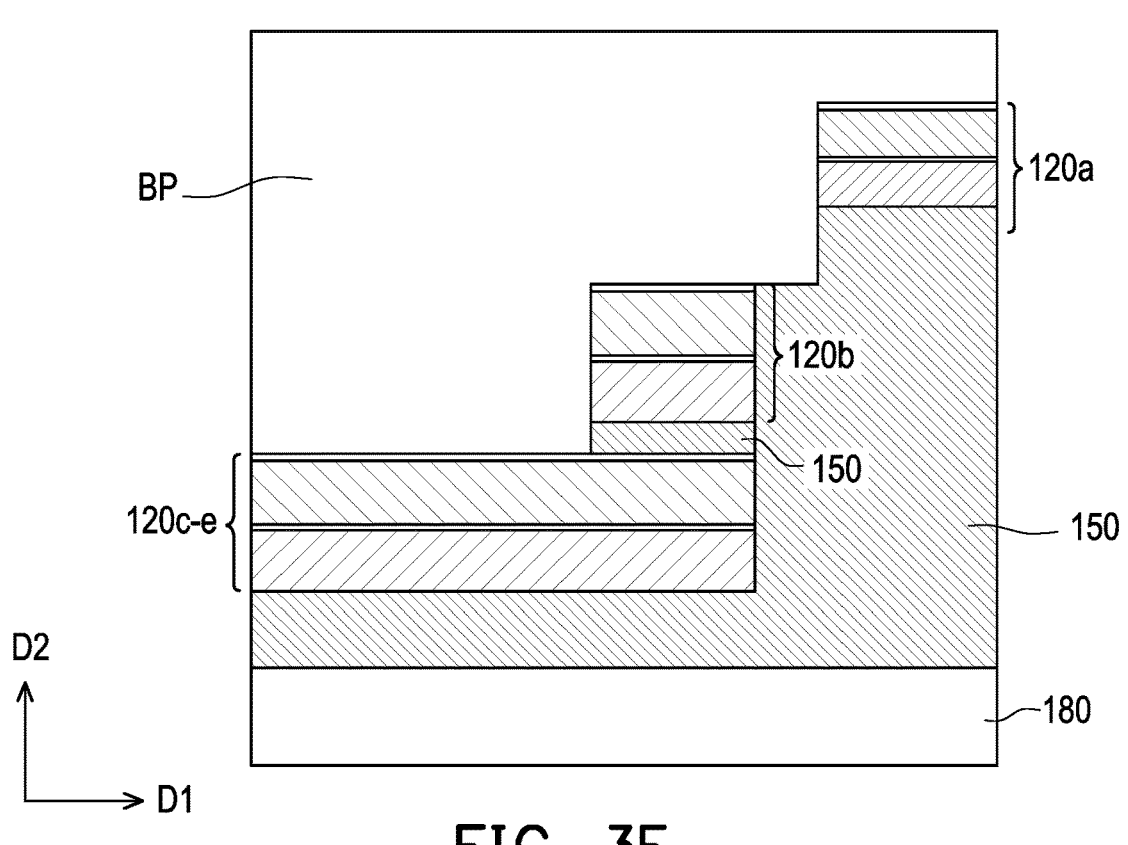

Please refer to FIG. 3E, the plurality of the first micro-light-emitting elements 120*a* and the plurality of the second micro-light-emitting elements 120*b* are covered with a conductive layer BP. In this embodiment, for example, the conductive layer BP covers the first micro-light-emitting element 120*a*, the second micro-light-emitting element 120*b* and the third epitaxial structure layer 120*c-e*.

Please refer to FIG. 3F, the display device is turned over again, so that the first micro-light-emitting element 120*a* and the second micro-light-emitting element 120*b* are bonded to the bonding layer CM (i.e., the metal circuit layer) of the control panel 100 through the conductive layer BP. Then, the substrate 180 and part of the adhesive layer 150 are removed. In this embodiment, since the gap GB1 is disposed according to the aforementioned process of the example in FIG. 3C, the projection of the first micro-light-emitting element 120*a* on the control panel 100 and the projection of the second micro-light-emitting element 120*b* on the control panel 100 neither overlap nor connect with each other.

Figures 3G, 3H:
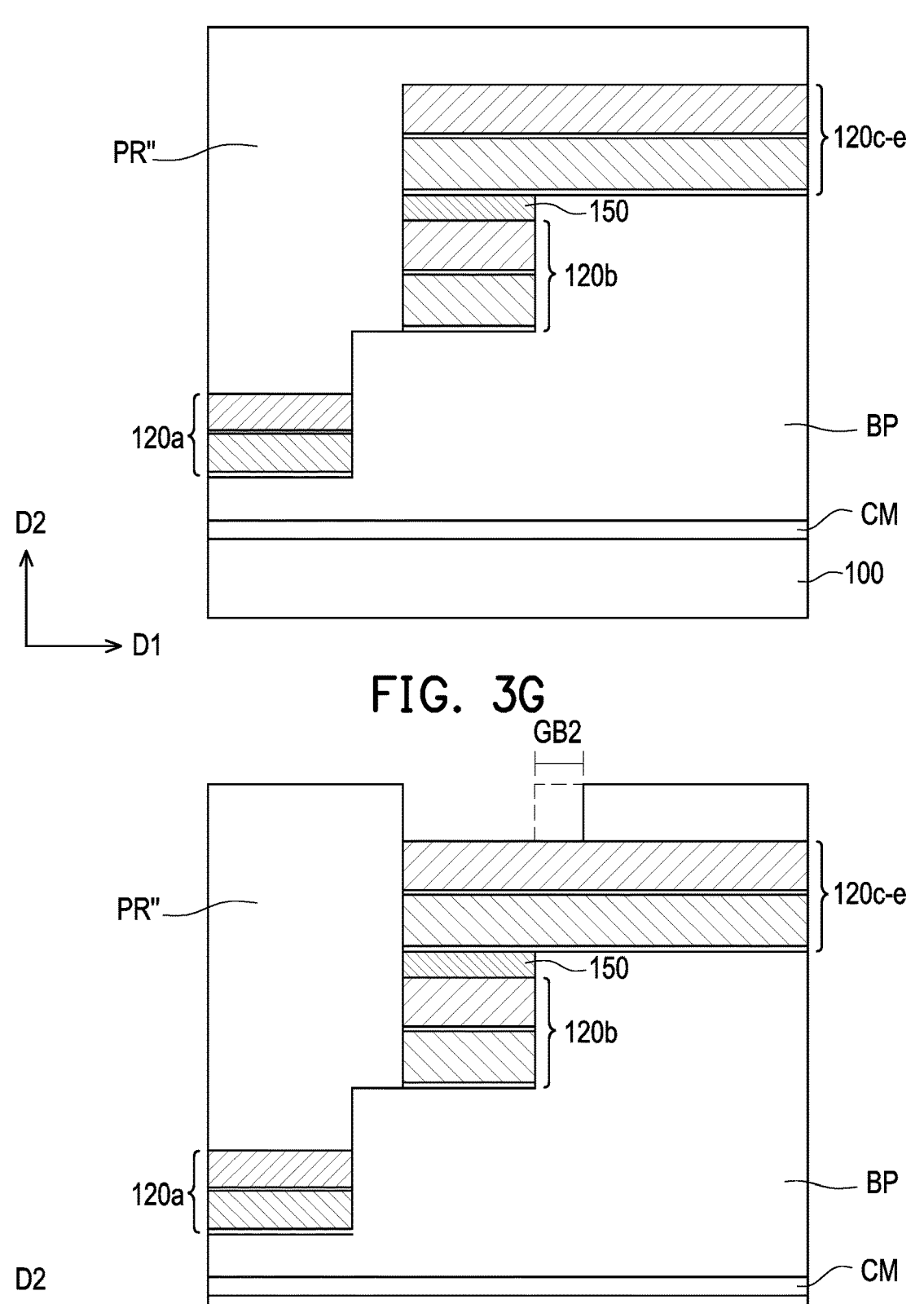

Please refer to FIG. 3G, the photoresist layer PR" is disposed on the display device. Then, please refer to FIG. 3H, the photoresist PR" on the overlapping portion between the third epitaxial structure layer 120*c-e* and the second micro-light-emitting element 120*b* is removed. And further a part of a portion of the photoresist PR" is removed and serves as a reserved space for a gap GB2, wherein the portion of the photoresist PR" is not on the overlapping portion between the third epitaxial structure layer 120*c-e* and the second micro-light-emitting element 120*b*.

Figure 3I:
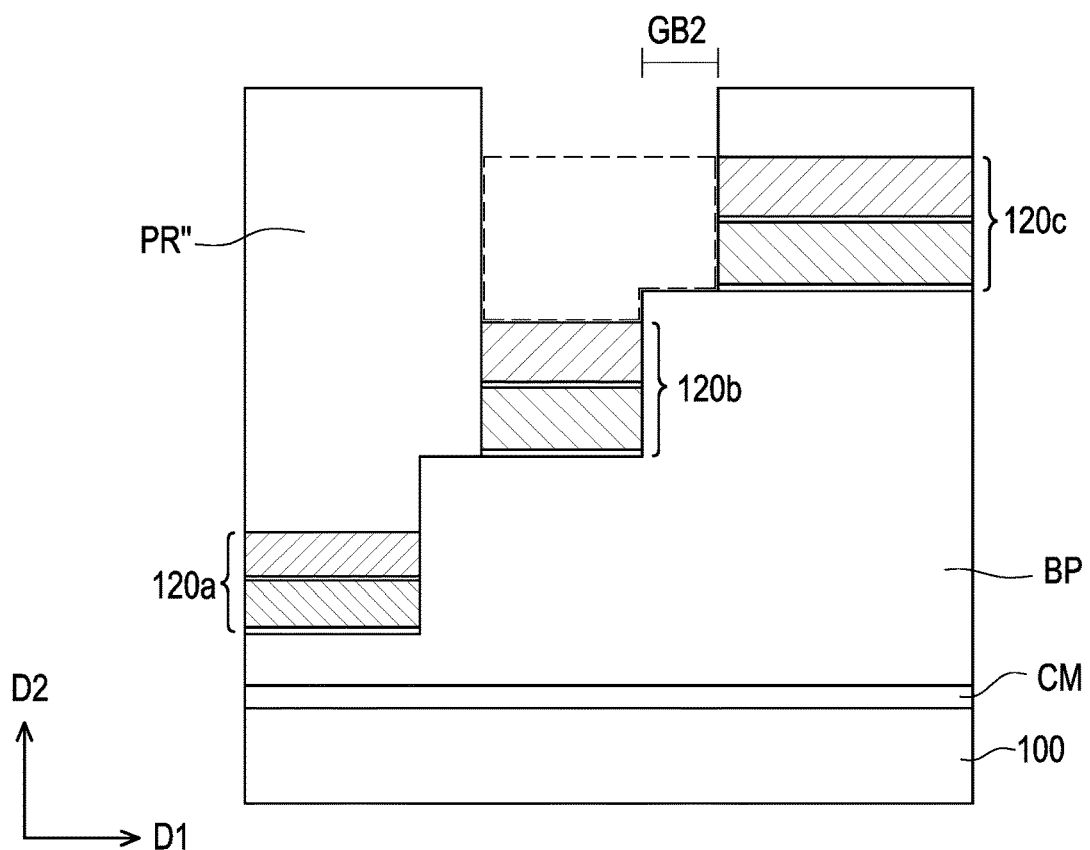

Please refer to FIG. 3I, the exposed third epitaxial structure layer 120*c-e* and the lower part of the adhesive 150 are etched. In this way, the remaining non-etched third epitaxial structure layer 120*c-e* forms the third micro-light-emitting element 120*c*.

Figure 3J:
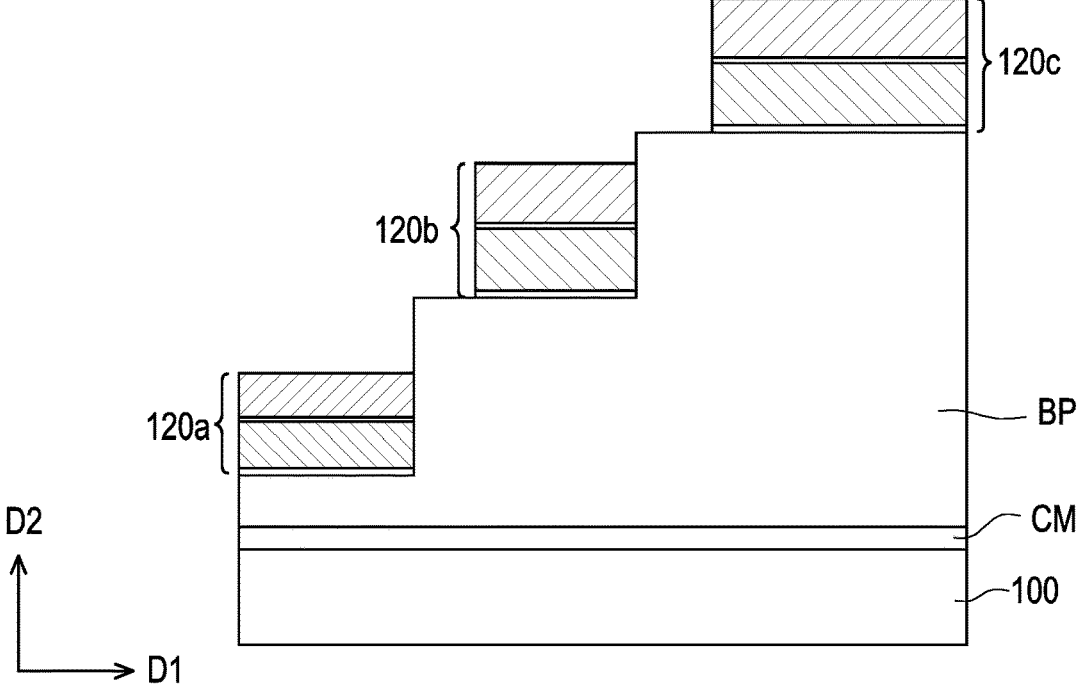
Figure 3K:
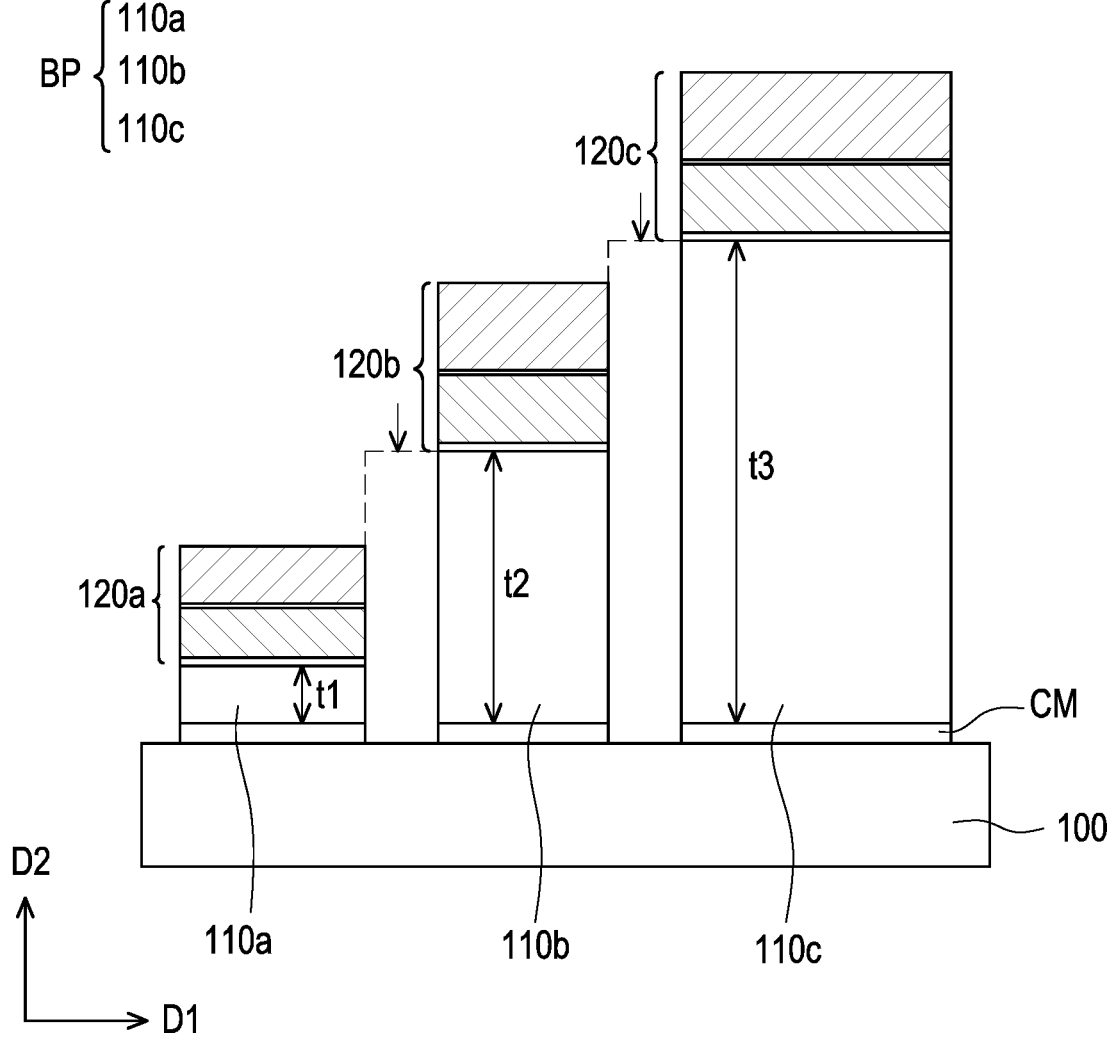

Please refer to FIG. 3J, the photoresist PR" is removed. Please refer to FIG. 3K, the conductive layer BP is patterned to be etched to expose the control panel 100. The conductive layer BP is etched and divided into a plurality of first conductive layers 110*a*, a plurality of second conductive layers 110*b* and a plurality of third conductive layers 110*c* (one is schematically shown in FIG. 3K). Each of the first micro-light-emitting elements 110*a*, the second micro-light-emitting elements 120*b* and the third micro-light-emitting elements 120*c* are respectively disposed on the first conductive layer 110a, the second conductive layer 110b and the third conductive layer 110c. In addition, the first conductive layer 110a, the second conductive layer 110b and the third conductive layer 110c are disposed on the control panel 100 separately from each other and are electrically insulated from each other. In this embodiment, in the operation of patterned etching the conductive layer BP further comprises etching the bonding layer CM, so that the bonding layer CM forms a plurality of bonding layers CM separated from each other and electrically insulated from each other. In addition, in the operation of FIG. 3E, further includes a planarization process after covering the conductive layer BP. For example, a chemical mechanical polishing process is configured to polish the top surface of the conductive layer BP. In this way, the plurality of first conductive layers 110a have the same first thickness t1, and the plurality of second conductive layers 110b have the same second thickness t2, and the plurality of third conductive layers 110c have the same third thickness t3. The first thickness t1, the second thickness t2 and the third thickness t3 are different from each other. That is, the operation in FIG. 3K is performed in an insulation process for the first micro-light-emitting element 120a, the second micro-light-emitting element 120b and the third micro-light-emitting element 120c and to remove the portion of the conductive layer BP connected to each other and the portion of the bonding layer CM connected to each other.

Figure 3L:
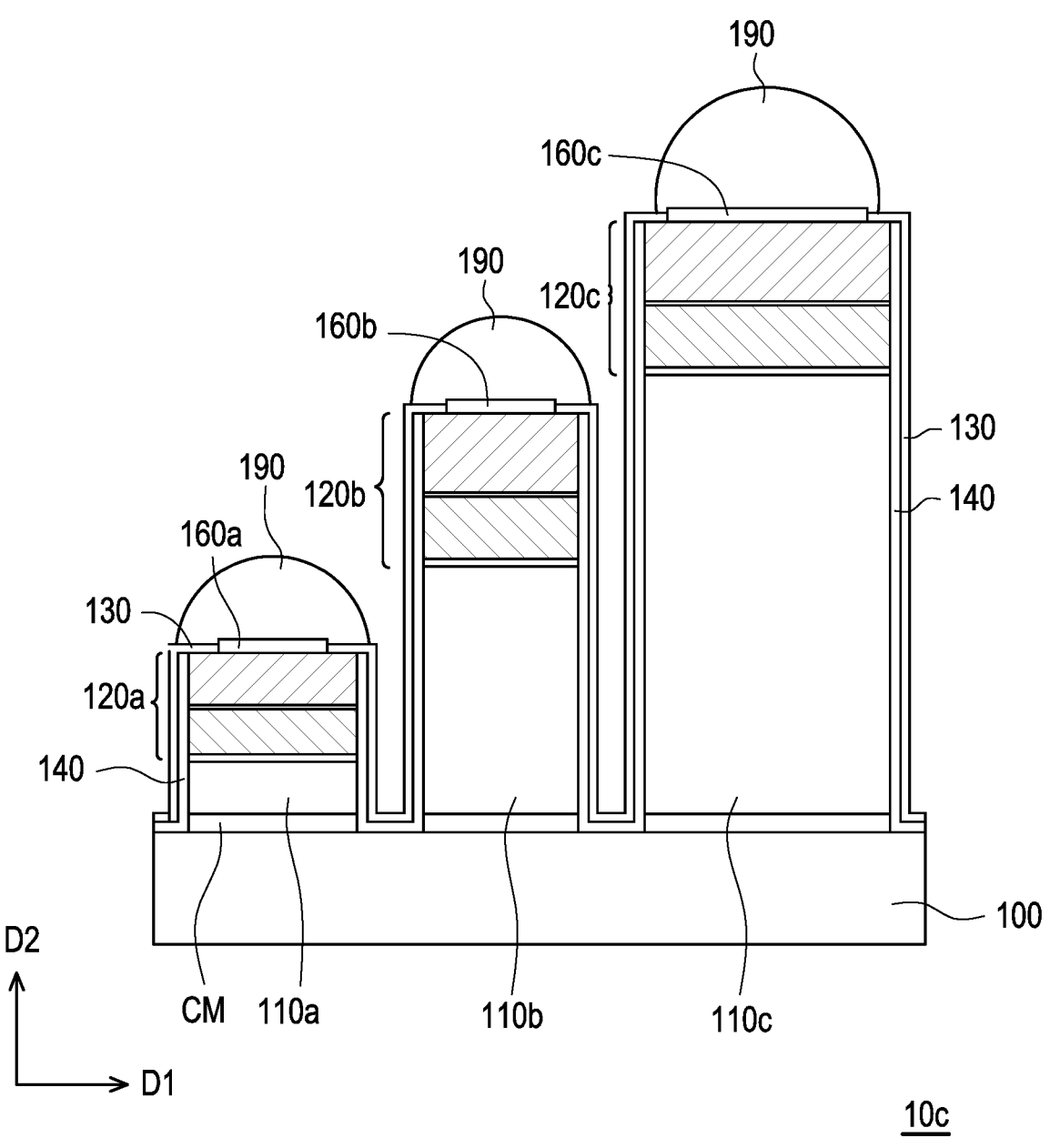

Please refer to FIG. 3L, peripheral surfaces of the first micro-light-emitting elements 120a, peripheral surfaces of the second micro-light-emitting elements 120b, peripheral surfaces of the third micro-light-emitting elements 120c, peripheral surfaces of the first conductive layers 110a, peripheral surfaces of the second conductive layers 110b, peripheral surfaces of the third conductive layers 110c, and control panel 100 are covered with the insulating layer 140.

Then, a light reflecting layer 130 is formed to cover a part of the first micro-light-emitting element 120a, a part of the second micro-light-emitting element 120b, a part of the third micro-light-emitting element 120c, the insulating layer 140, and the control panel 100. Specifically, in this embodiment, the part of the insulating layer 140 covering the top surface of each of the micro-light-emitting elements is completely removed, and then the light reflecting layer 130 completely covers the top surface of each of the micro-light-emitting elements. Then, the light reflecting layer 130 covering a central area on the top surface of each of the micro-light-emitting elements is removed, so that the light emitted by the plurality of micro-light-emitting elements can be transmitted to the outside through an exposed area of the light reflecting layer 130.

Then, color filter 160a, color filter 160b and color filter 160c can be formed or disposed on the top surfaces of the first micro-light-emitting element 120a, the second micro-light-emitting element 120b and the third micro-light-emitting element 120c respectively, and the lens layer 190 is formed or disposed on the color filter 160a, the color filter 160b and the color filter 160c.

Meanwhile, display device 10c is completed. Therefore, the fabrication method of the display device of this embodiment does not require a back-end transferring process, which can greatly improve the yield rate and reduce costs (such as transfer, repair, etc. costs). At the same time, it can achieve better color gamut, and improve the light-emitting efficiency and lifespan without the quantum dot color conversion structure. In addition, in this embodiment, a method of photolithography is used to define the first micro-light-emitting element 120a, the second micro-light-emitting element 120b and the third micro-light-emitting element 120c.

Accuracy of photolithography method is much greater than accuracy of mass transfer process. Therefore, the upper limit of the resolution of the display device 10c can be significantly improved.

In addition, in this embodiment, the first micro-light-emitting element 120a, the second micro-light-emitting element 120b, and the third micro-light-emitting element 120c are independent of each other and are not overlapped on the control panel 100. The light-emitting areas and/or quantities for the first micro-light-emitting element 120a, the second micro-light-emitting element 120b, and the third micro-light-emitting element 120c are determined by the patterned etching process and will not be affected to each other. Therefore, in each pixel, the light-emitting area and/or the number of each of light-emitting elements can be freely allocated or designed redundantly, therefore preventing from crosstalk or parasitic capacitance problems arising from the circumstances that the micro-light-emitting elements overlap with each other.

Furthermore, the side of the first-type semiconductor on the first micro-light-emitting element 120a, the second micro-light-emitting element 120b and the third micro-light-emitting element 120c can share an electrode (that is, connected by the light reflecting layer 130 to form an electrode). The electrode only needs to be coated in one time. The electrode combined with the conductive layer 110 forms a complete light reflective surface.

The bonding layer CM is also separated during the operation of the conductive layer BP separation. After turning over to the control panel 100, the bonding operation for the first micro-light-emitting element 120a, the second micro-light-emitting element 120b and the third micro-light-emitting element 120c respectively can be finished during the insulation operation.

In the present invention. it should be noted that in the operation of stacking each of epitaxial structure layers, each of first-type semiconductors can be thinned and a roughened structure is formed on surface of each of first-type semiconductors simultaneously. The above operation can not only optimize the light extraction efficiency of micro-light-emitting elements, but also increase the ratio of the space d to the heights H1, H2, and H3 (ie, the aspect ratio). In this way, the coating yield rate of the light reflecting layer 130 and the insulating layer 140 can be improved, making it suitable for ultra-high-resolution micro-light-emitting displays.

Figure 4A:
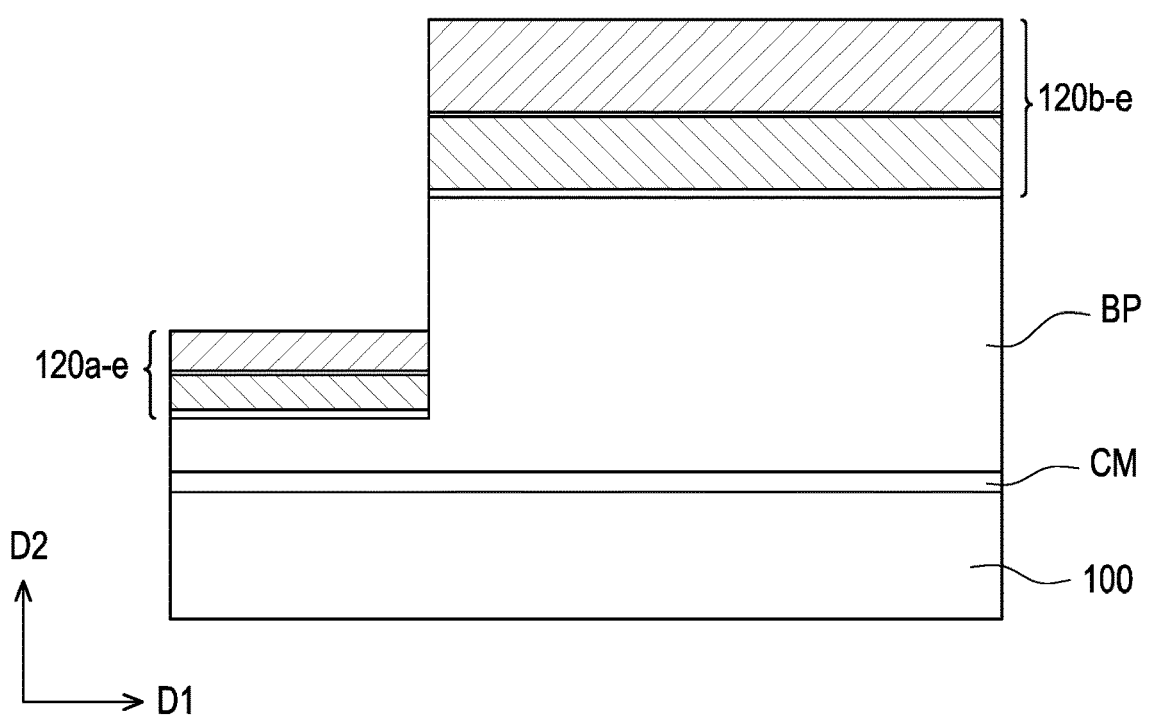
FIG. 4A to FIG. 4B are partial flow diagrams of a fabrication method of a display device according to an embodiment of the present invention.
Figure 4B:
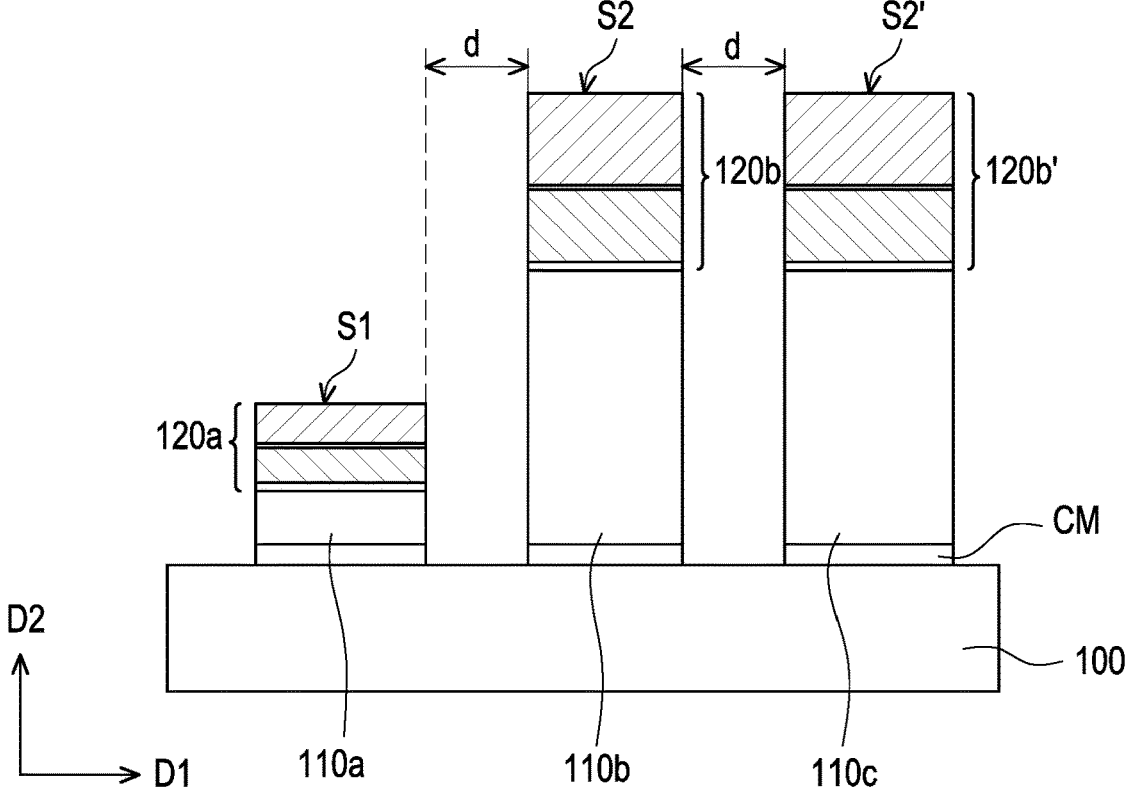

FIG. 4A to FIG. 4B are partial flow diagrams of a fabrication method of a display device according to an embodiment of the present invention. Please refer to FIGS. 4A-4B. The fabrication method of the display device of this embodiment is similar to the fabrication method of the display device of FIGS. 3A-3L, and part of the operation description will be omitted and will not be repeated. The main differences between these two embodiments are described below. In the fabrication method of the display device of this embodiment, the first epitaxial structure layer 120a-e and the second epitaxial structure layer 120b-e are sequentially stacked on the first substrate 170, and the remaining epitaxial structure layer is transferred to the second substrate 180 after etching the second epitaxial structure layer 120b-e from the first side. Then the first epitaxial structure layer 120a-e is etched from the second side, and a conductive layer BP is formed on the remaining epitaxial structure layer. The conductive layer BP is bonded to the bonding layer CM on the control panel 100, as shown in FIG. 4A. It can be understood that FIG. 4A is an embodiment in which two epitaxial structure layers are stacked, and corresponds to the state of FIG. 3J in which three epitaxial structure layers are stacked. Please refer to FIGS. 4A and 4B, the conductive layer BP is patterned to be etched. This operation may further include sequentially etching a portion of at least one of the first epitaxial structure layer 120*a-e* and the second epitaxial structure layer 120*b-e*. (compared with FIG. 4A and FIG. 4B, the part marked with the space d in FIG. 4B is etched), so that the projection of the first micro-light-emitting elements 120*a* on the control panel 100 do not connect with the projections of the second micro-light-emitting elements 120*b*, 120*b'* on the control panel 100. In addition, the bonding layer CM is also patterned and etched, as shown in FIG. 4B.

Taking FIG. 4B as an example, in the operation of etching the second epitaxial structure layer 120*b-e*, the number of the second micro-light-emitting elements 120*b* and 120*b'* is at least two times more than the number of the first micro-light-emitting elements 120*a*. That is, in one pixel area, two second micro-light-emitting elements 120*b* and 120*b'* are formed by separating the same second epitaxial structure layer 120*b-e*.

In this embodiment, there are only two kinds of micro-light-emitting elements on the control panel 100. In a situation of a higher resolution (Pixels Per Inch, PPI), the space between pixels is extremely small. When there are only two types of micro-light-emitting elements on the control panel, the space d between the micro-light-emitting elements and the ratio of the maximum height of the micro-light-emitting elements (ie, the aspect ratio) can be further increased. In this way, problems such as etching failure during the insulation operation or poor coating quality of the insulating layer 140 and the light reflecting layer 130 can be avoided.

Similar to the above description of the operations in FIG. 3L, after the operations in FIG. 4B, the insulating layer 140, the light reflecting layer 130, the color filters 160*a*, 160*b*, 160*c* and the lens layer 190 can be formed as shown in the operations in FIG. 3L to obtain the display device 10*b* as shown in FIG. 1B. However, before the color filter 160*c* is formed, a groove g1 can be formed (such as etched) on the top of the first-type semiconductor 120*b-s*1 of the second micro-light-emitting element 120*b'*, and then the color conversion structure 160*c*-1 is filled into the groove g1. Then, the color conversion structure 160*c*-1 covers the color filter 160*c*. In the situation of a higher resolution (Pixels Per Inch, PPI), dimension of micro-light-emitting devices is further reduced, causing the external quantum efficiency (EQE) being affected significantly by the sidewall effect. In the above embodiments, since an influence of the second micro-light-emitting element (such as blue light) is less than an influence of the third micro-light-emitting element (such as red light), the display device with only the first micro-light-emitting element 120*a* and the second micro-light-emitting element 120*b*2 can be effectively improved in the problem of poor external quantum effects. In addition, the color conversion structure 160*c*-1 has a better conversion rate for long wavelengths, and the loss of external quantum effects is relatively small.

To sum up, in the display device of the embodiment of the present invention, since the second thickness of the second conductive layer is greater than the first thickness of the first conductive layer, and the projections of the first micro-light-emitting element on the control panel do not overlap with the projections of the second micro-light-emitting element on the control panel. Therefore, micro-light-emitting elements with different light-emitting colors are independent of each other and do not overlap with each other. A light-emitting area within the pixel formed by micro-light-emitting elements with different light-emitting colors can be freely allocated or designed redundantly, therefore preventing from crosstalk or parasitic capacitance problems arising from the circumstances that the micro-light-emitting elements overlap with each other. In the embodiment of the fabrication method of the display device of the present invention, the first micro-light-emitting elements and the second micro-light-emitting elements are stacked and etched, and the first micro-light-emitting elements finally retained on the control panel and the second micro-light-emitting elements finally retained on the control panel do not overlap with each other. Therefore, the display device and fabrication method therefor in the embodiment of the present invention can allow micro-light-emitting elements with different colors of light to be formed together without mass transfer process. In this way, it can significantly improve the yield rate of the display device fabrication and reduce the cost of transferring and repairing.

What is claimed is:

1. A fabrication method for a display device, comprising:
   sequentially stacking a first epitaxial structure layer and a second epitaxial structure layer on a first substrate;
   etching the second epitaxial structure layer from a first side and etching the first epitaxial structure layer from a second side to form a plurality of first micro-light-emitting elements and a plurality of second micro-light-emitting elements, wherein color of light emitted by the plurality of first micro-light-emitting elements are different from color of light emitted by the plurality of second micro-light-emitting elements;
   covering the plurality of the first micro-light-emitting elements and the plurality of the second micro-light-emitting elements with a conductive layer, so that the plurality of the first micro-light-emitting elements and the plurality of the second micro-light-emitting elements are bonded to a control panel through the conductive layer, wherein projections of the plurality of first micro-light-emitting elements on the control panel do not overlap with projections of the plurality of second micro-light-emitting elements on the control panel; and
   patterned etching the conductive layer to expose the control panel, wherein the conductive layer is etched and divided into a plurality of first conductive layers and a plurality of second conductive layers, the plurality of first micro-light-emitting elements are correspondingly disposed in the plurality of first conductive layers, the plurality of second micro-light-emitting elements are correspondingly disposed in the plurality of second conductive layers, and the plurality of first conductive layers disposed on the control panel and the plurality of second conductive layers disposed on the control panel are separated from each other and are electrically insulated from each other.

2. The fabrication method for a display device according to claim 1, wherein in process of etching the second epitaxial structure layer, and number of the plurality of the second micro-light-emitting elements is at least two times more than number of the plurality of first micro-light-emitting elements.

3. The fabrication method for a display device according to claim 1, wherein the control panel further comprises a bonding layer, the conductive layer is bonded to the control panel through the bonding layer, and in process of patterned etching the conductive layer, the fabrication method further comprises etching the bonding layer together, so that the bonding layer forms a plurality of bonding layers which are separated from each other and electrically insulated from each other.

4. The fabrication method for a display device according to claim 1, wherein a region where the second epitaxial structure layer is etched from the first side partially overlaps with an region where the first epitaxial structure layer is etched from the second side, so that the projections of the plurality of first micro-light-emitting elements on the control panel do not connect with the projections of the plurality of second micro-light-emitting elements on the control panel.

5. The fabrication method for a display device according to claim 1, further comprising a planarization process after covering the conductive layer, so that the plurality of first conductive layers have the same first thickness, the plurality of second conductive layers have the same second thickness, and the first thickness is different from the second thickness.

6. The fabrication method for a display device according to claim 1, further comprising forming an insulating layer covering the plurality of first micro-light-emitting element, the plurality of second micro-light-emitting element and the control panel.

7. The fabrication method for a display device according to claim 1, further comprising forming a color conversion structure in part of the plurality of second micro-light-emitting elements, wherein the color conversion structure is disposed in a groove located between a top surface of the second micro-light-emitting element away from the control panel and a second light-emitting layer of the second micro-light-emitting element.

8. The fabrication method for a display device according to claim 1, further comprising forming a light reflecting layer covering a part of the plurality of the first micro-light-emitting elements, and a part of the plurality of the second micro-light-emitting elements, and the control panel.

9. The fabrication method for a display device according to claim 1, after etching the second epitaxial structure layer from a first side, further comprising:

providing a second substrate;

transferring the first epitaxial structure layer and the etched second epitaxial structure to the second substrate; and removing the first substrate and etching the first epitaxial structure layer from the second side.

10. The fabrication method for a display device according to claim 1, wherein process of patterned etching the conductive layer further comprises sequentially etching a portion of at least one of the first epitaxial structure layer and the second epitaxial structure layer, so that the projections of the plurality of first micro-light-emitting elements on the control panel do not connect with the projections of the plurality of second micro-light-emitting elements on the control panel.

* * * * *